(12) United States Patent
Alsmeier (10) Patent No.: US 7,256,440 B2
(45) Date of Patent: Aug. 14, 2007

(54) SEMICONDUCTOR MEMORY CELL HAVING A TRENCH AND A PLANAR SELECTION TRANSISTOR AND METHOD FOR PRODUCING THE SAME

(75) Inventor: Johann Alsmeier, Ottobrunn (DE)

(73) Assignee: Infineon Technologies AG, Munich (DE)

(*) Notice: Subject to any disclaimer, the term of this patent is extended or adjusted under 35 U.S.C. 154(b) by 271 days.

(21) Appl. No.: 10/913,797

(22) Filed: Aug. 6, 2004

(65) Prior Publication Data

US 2005/0077563 A1    Apr. 14, 2005

Related U.S. Application Data

(63) Continuation of application No. PCT/DE03/00284, filed on Jan. 31, 2003.

(30) Foreign Application Priority Data

Feb. 7, 2002    (DE) ................ 102 05 077

(51) Int. Cl.
    *H01L 27/108*    (2006.01)
(52) U.S. Cl. ............... 257/301; 257/304; 257/305; 257/E27.092
(58) Field of Classification Search ........... 257/301, 257/304, 305, E27.092, E27.093
    See application file for complete search history.

(56) References Cited

U.S. PATENT DOCUMENTS

| | | | |
|---|---|---|---|
| 5,867,420 A | 2/1999 | Alsmeier | |
| 5,936,271 A * | 8/1999 | Alsmeier et al. | 257/301 |
| 5,945,704 A | 8/1999 | Schrems et al. | |
| 6,018,174 A | 1/2000 | Schrems et al. | |
| 6,100,131 A | 8/2000 | Alsmeier | |
| 6,265,741 B1 | 7/2001 | Schrems | |
| 6,399,977 B1 | 6/2002 | Alsmeier | |
| 2004/0159873 A1* | 8/2004 | Goldbach et al. | 257/301 |

FOREIGN PATENT DOCUMENTS

| EP | 0 908 948 A2 | 4/1999 |
|---|---|---|
| EP | 0 949 684 A2 | 10/1999 |

* cited by examiner

*Primary Examiner*—Zandra V. Smith
*Assistant Examiner*—Toniae M. Thomas
(74) *Attorney, Agent, or Firm*—Slater & Matsil, L.L.P.

(57) ABSTRACT

A trench (12) of a semiconductor memory cell (1) has an insulation collar (44), which is open toward the substrate (42) on just one side (50). On the other side (52), the insulation collar (44, 47, 55) rises all the way up to the insulation cover (62). There is therefore no need for a shallow trench isolation. The contact (70) which is buried on one side is formed by oblique implantation, for example with $N_2$ or argon, the implantation taking place from a fixedly predetermined direction with an angle of inclination of between 15 and 40°. The implantation substances effect different etching or oxidation properties, etc., of the implanted materials. In combination with this method, it becomes possible to realize a new layout for the semiconductor memory cell (1), in which the structures for forming the active areas form long lines (31) extending over a plurality of adjacent semiconductor memory cells.

21 Claims, 6 Drawing Sheets

SEMICONDUCTOR MEMORY CELL HAVING A TRENCH AND A PLANAR SELECTION TRANSISTOR AND METHOD FOR PRODUCING THE SAME

This application is a continuation of co-pending International Application No. PCT/DE03/00284, filed Jan. 31, 2003, which designated the United States and was not published in English, and which is based on German Application No. 102 05 077.5, filed Feb. 7, 2002, both of which applications are incorporated herein by reference.

TECHNICAL FIELD

The present invention relates to a semiconductor memory cell having a trench and a planar select transistor, and to two methods for fabricating it. In particular, the present invention also relates to an arrangement of semiconductor memory cells in a memory cell array.

BACKGROUND

In a known embodiment, semiconductor memory cells with random access to information stored in a storage capacitor include, as dynamic memory cells, a planar select transistor and a deep trench in which the storage capacitor is formed. At the planar select transistor, a gate contact is arranged on the substrate surface and is formed directly between two doped diffusion regions at the substrate surface. In this document, the term "gate contacts" is used to refer to all active surfaces of the transistor, i.e., the interfaces of word lines and active areas, which, for example, may be separated from one another only by a very thin gate oxide layer.

A bit line contact, via which an electric charge released by the select transistor can be read from the storage capacitor, is connected to a first of the diffusion regions. The other diffusion region is connected via a buried strap to a conductive material, typically polysilicon, in the trench arranged next to the diffusion region. The conductive material in the deep trench functions as a storage electrode for the capacitor, while, for example, a deeply buried doped plate in the substrate serves as a second capacitor electrode, with a thin dielectric layer located between the two electrodes. A word line controls the select transistor via the gate contact for switching an electrically conductive connection from the storage capacitor to the bit line.

To achieve the highest possible integration densities in a memory cell array, it is generally endeavored to minimize the surface area taken up by an individual semiconductor memory cell. For a memory cell with a planar select transistor, the footprint of the smallest memory cell, which can be fabricated conventionally is 8 $F^2$, where F is the smallest length dimension that it is possible to produce by lithography (minimum feature size) on a wafer. In production installations for memory products, F is currently undergoing a transition from 0.15 µm to 0.13 µm.

The area of 8 $F^2$ results from the sum of the two structures produced by lithography—namely the gate contact and the trench—in a semiconductor memory cell, which for a planar arrangement of the select transistor must be at a distance of approximately 1 F from one another, and the required trench isolation, which isolates the active diffusion areas of the cell from those of an adjacent memory cell.

Semiconductor memory cells according to the prior art with trench and planar select transistor are known, for example, from documents EP 0 908 948 A2 and EP 0 949 684 A2.

Figure 1:
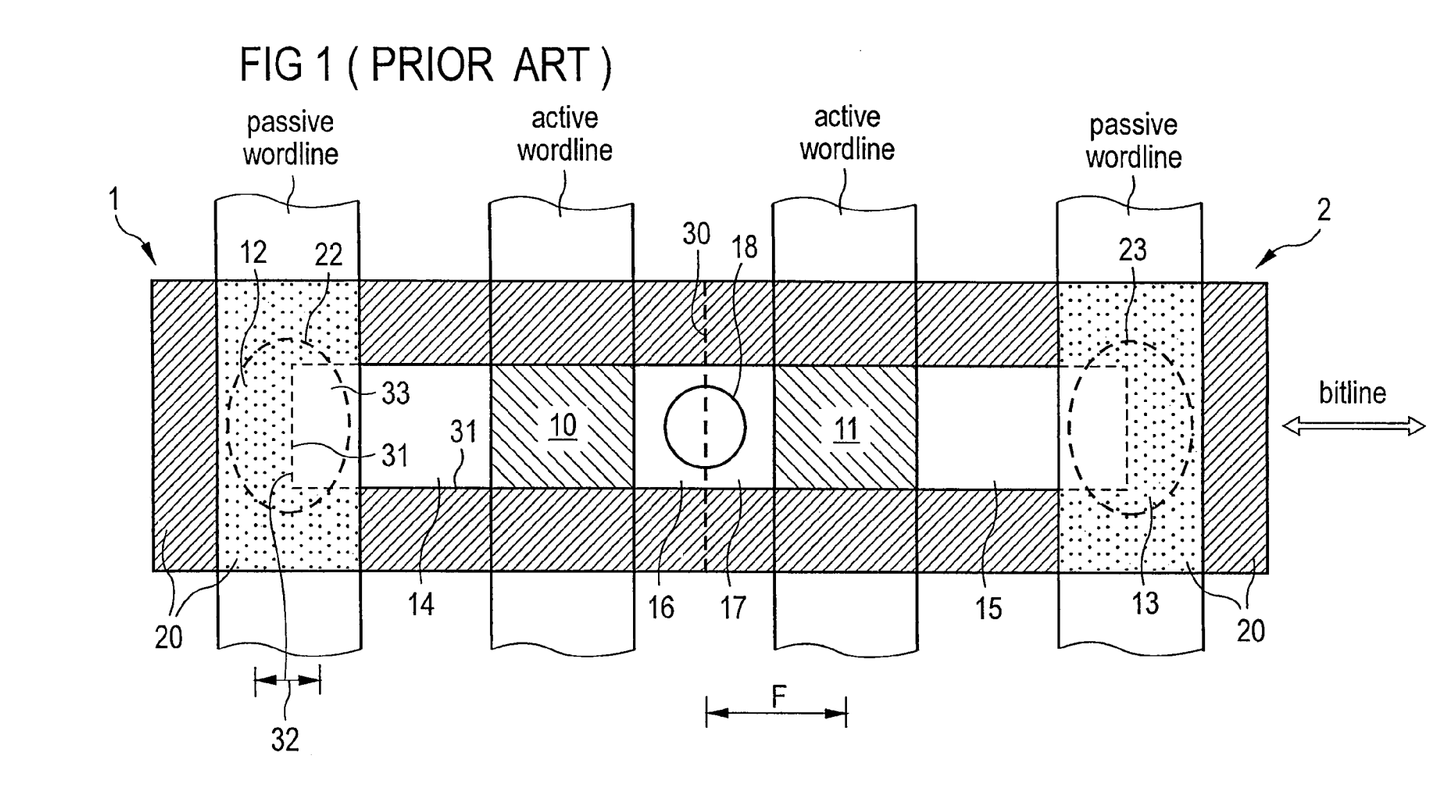
FIG. 1 shows a plan view of two adjacent memory cells in accordance with the prior art.

FIG. 1 illustrates an example of a layout, which is currently in widespread use for a semiconductor memory cell, with an adjacent cell additionally being included in the figure in order to illustrate their relative arrangement in a memory cell array. The two semiconductor memory cells 1, 2 are arranged mirror-symmetrically about an interface 30, which is perpendicular to the plane of the drawing in FIG. 1. The interface 30 and also the interfaces between the other sides of the memory cells represent their imaginary, logic outer limits and serve to facilitate the assignment of individual structures in a dense, periodic array to the respective memory cells. In the present example, the interface 30 is defined by a mirror plane of the structures assigned to two adjacent memory cells.

In the diagrammatic plan view shown in FIG. 1, the trenches 12, 13 are illustrated in the form of rectangles, as they are formed on a mask for patterning the trenches on the wafer. However, the projected image on the wafer depicts trenches with oval cross-sections 22 and 23, respectively. A gate contact 10, which is connected to a word line WL and forms a transistor, allows electrically conductive connection of the trench 12, via a first diffusion region 14, to a second diffusion region 16, with which contact is made from above, in the plane of the drawing shown in FIG. 1, by a bit line contact 18. The memory cells 1 and 2 share the bit line contact 18 and the second diffusion region 16 and 17. The bit line contact 18 is connected to a bit line BL running in the X direction above the plane of the drawing shown in FIG. 1.

The definition of the diffusion regions 14, 15, 16, 17 in the two cells 1, 2 and of the isolation trench 20 for isolating the active areas of the semiconductor memory cells 1, 2 from further, adjacent semiconductor memory cells (not shown) is achieved by the lithographic projection of precisely one structure 31 into, in each case, two cells in the memory cell array to be formed on the wafer. The bar-like structure 31 is initially formed as a resist mask on the surface so that the shallow isolation trenches 20 (shallow trench isolation, STI) can be formed in the silicon substrate in an etching step. After the resist mask has been removed, an oxide is deposited in the trenches, for example in an HDP process (High-Density Plasma process), and then planarized. Then, the gate contacts 10, 11, the word lines WL and, by implantation with subsequent activation of the diffusion regions 14-17, are formed.

In a conventional method for forming the memory cells 1, 2, first of all the trench is formed in a substrate. A dielectric layer which serves as capacitor dielectric is deposited on the inner wall of the trench. The trench is then filled for the first time with a conductive material. The conductive material, together with the dielectric layer, is etched back, so that the capacitor electrode is formed only in a lower region of the trench. Above the etched-back conductive material which comprises, for example, a polysilicon, an insulation collar consisting of oxide is formed at the trench inner wall in a CVD process. Then, in a second filling process, conductive material is deposited into the trench for a second time using a CVD process and etched back, so that there is a distance of, for example, 100 nm from the top edge of the conductive material to the silicon surface. The insulation collar, which projects above this top edge, is removed in an etching step, so that the trench inner wall, which consists of silicon, is uncovered in an upper region of the trench. Then, a third filling with conductive material, which is now highly doped for outdiffusion under the influence of heat, is deposited.

In the completed memory cell, passive second word lines WLs, which can be used to drive gate contacts of adjacent memory cells (not shown in FIG. 1), run over the trenches 12, 13. Therefore, an insulation layer for the second, passive word line WL running above is required above the conductive material of the third filling in the trenches 12, 13. This is made possible by deposition of an oxide above the conductive material of the third filling in a joint step with the filling of the shallow trench isolation 20.

The shallow trench isolation extends sufficiently deep into the substrate for it to reach the top edge of the insulation collar at the trench inner wall, so that there is no electrically conductive connection produced between the adjacent trenches 22, 23 of two adjacent memory cells. In this context, it should be borne in mind that the shallow isolation trench 20 covers approximately half the diameter of the trench 12, so that a sufficiently large buried strap of the conductive material is still available, for example, in the upper region of the trench 12 to the substrate of the diffusion region 14.

On the other hand, if the structure 31 is positioned inaccurately on the trench structure 12, on the one hand the contact surface at the buried strap may be reduced in size or even prevented altogether if an excessively small overlap region 33 is formed between the structure 31 and the trench structure 12. On the other hand, however, if an excessively large overlap region 33 is formed, an undesired diffusion contact may occur on the opposite side of the trench 12. Consequently, to maintain the quality of semiconductor memory cells according to the prior art of this nature, very high demands are imposed on the positional accuracy and sizes of structures and/or very tight tolerances 32 are required with regard to positional accuracy or critical dimension (CD). However, these demands are becoming increasingly difficult to satisfy using lithographic techniques with the constant decrease in feature size.

SUMMARY OF THE INVENTION

Accordingly, the object of the present invention is to propose a semiconductor memory cell in which the above-mentioned problems relating to the relative positional accuracy of trench structures 12, 13 and trench isolation structures 20 are reduced and/or the demands imposed on positional accuracy tolerances are not particularly high.

Furthermore, it is an object of the present invention to avoid the fluctuation in the contact resistance of the buried strap, which is associated with only a minor positional inaccuracy.

The semiconductor memory cell according to the invention has an insulation collar which comprises an opening on just one side of the trench inner wall. The conductive material surrounded by the insulation collar is in contact, through the opening, with the substrate at the trench inner wall on precisely this side. This side is located in the direction of the first diffusion region, so that a buried strap to the first diffusion region is produced.

On the opposite side from the opening in the trench, by contrast, the insulation collar runs all the way up to the insulation layer at the same height as the opening at the inner wall, so that the conductive material, on the opposite side from the opening, is not in electrically conductive contact with the silicon substrate. Conventionally, the buried strap is realized by the conductive material extending above the top edge of the insulation collar, where it makes contact with the substrate. The insulation required for the opposite side is ensured there by the deeply etched shallow isolation trench (STI). According to the invention, the insulation collar is maintained opposite the opening for the buried strap, so that there is no need to provide any additional insulation on the opposite side from the buried strap.

According to the invention, the opening preferably comprises an incision on precisely one side, at the top edge of the insulation collar. The top edge is then recessed on the side of the opening, the contact side, compared to the other side, on which the insulation collar is connected to the insulation cover or the insulation layer. However, the opening may also comprise a hole on the side of the contact collar so that the top edge of the insulation collar is retained all the way around the trench inner wall.

Forming the insulation collar according to the invention produces the significant advantage that the structures used to form the active areas do not have to end above the trenches in order to form accurately aligned overlap regions 33, but rather can extend as far as an interface with the adjacent cell. At this interface, it meets the corresponding structure of the adjacent cell, so that the present invention results in a line structure extending over a large number of semiconductor memory cells. Since this means that the bar structures in the semiconductor memory cells are no longer limited, but rather form continuous lines, the problem of positional accuracy of structures for defining the active areas and/or trench isolation with respect to the trench structures for defining the storage capacitors is greatly reduced. This applies in particular to the longitudinal direction of the structures for defining the active areas.

A further advantage derives from the fact that, by virtue of the possibility of dispensing with the shallow trench isolation between two adjacent trenches, it becomes possible to assign a dedicated bit line contact to each cell. A bit line contact may be patterned in self-aligned fashion between a first, active word line with gate contact and a second, passive word line formed above a trench. The gate contact—and therefore the select transistor—can therefore be formed with a greater width compared to a cross-section of the same word line at a location where, as a passive work line, it crosses over a trench of an adjacent cell. This is possible without the center of gravity of the gate contact having to be moved toward the buried strap.

An arrangement of a plurality of memory cells in a memory cell array can be effected by the present invention in such a manner that the orientation of a memory cell which is predetermined by the relative alignment of gate contact and trench is selected to be identical for all the memory cells. For example, in the layout of a memory cell array, for all the memory cells the trench can in each case be arranged on the left and the gate contact can in each case be arranged on the right of the rectangular area, when viewed horizontally, of a memory cell area. This has the advantage that lithographic problems with structures located close together on the mask, such as pairs of trench capacitors, for example resulting from lens aberrations, are avoided according to the present invention.

This is because according to the prior art left/right asymmetries of line widths were able to occur. On account of the uniform, symmetrical arrangement of structures, this scenario does not arise in the present invention. The trenches in the layout are arranged in the form of a chessboard pattern on the substrate with respect to the matrix-like arrangement of mutually intersecting bit and word lines. This means that, for example alternately, every second intersection point of a word line with a bit line—when seen in plan view—lies precisely at the location of the trench.

The advantageous structuring of the insulation collar with an opening which faces in the direction of the gate contact and therefore forms a buried strap and a top edge which is at a higher level on the opposite side from the opening is achieved, according to two methods according to the invention for fabricating the memory cell, in each case in particular by means of an additional implantation step. The implantation in this context serves not to change electrical conduction properties of the substrate or oxide, which is implanted, but rather to change properties of the implanted material in a subsequent process step compared to the same material, which is not implanted. Therefore, according to the invention, it is possible to change process properties of one side of the trench inner wall compared to the opposite side of the trench inner wall by means of oblique implantation from just one direction.

The two methods differ by virtue of the fact that in a first method an insulation collar is opened up following an etching step on the unimplanted side, whereas in a second method the insulation collar is opened up after a corresponding etching step on the implanted side. In particular configurations, argon and $N_2$ are respectively cited for this purpose. These are described in more detail in exemplary embodiments.

By way of example, the process of thermal oxidation of silicon can be accelerated by a factor of more than 2 by implantation of argon. This means that after the thermal oxidation process, the implanted side of the trench has a layer thickness, which has more than doubled compared to the unimplanted side. Therefore, with a constant material-removal rate in an isotropic etching process, an opening toward the silicon substrate is uncovered sooner on the opposite side of the trench inner wall from the implanted side. It is preferable for the etching process to be terminated at precisely this point. In the present case, the implanted side still has an oxide layer, which retains more than half its original thickness prior to the start of the etching process.

The etching selectivity can also be influenced by the implantation. In the case of $N_2$, and implanted oxide is etched with a material-removal rate which is slightly more than doubled, under the same etching conditions, compared to an unimplanted oxide. According to the invention, this is advantageously used on an oxide of the insulation collar which, unlike in the prior art, is not carried out immediately after the second etching-back step. Rather, the oxide insulation collar remains in place here and is implanted with $N_2$. In the subsequent etching step, the implanted side is removed significantly more quickly, so that an opening to the silicon substrate is formed on this side first. The etching process is preferably terminated at this instant, so that the oxide layer on the opposite side still retains a sufficient thickness.

BRIEF DESCRIPTION OF THE DRAWINGS

The present invention is now to be explained in more detail on the basis of exemplary embodiments and with the aid of drawings, in which:

FIG. 2, which consists of FIGS. 2a-2c, shows an example of the process sequence for the method according to the invention with $N_2$ implantation;

FIG. 3, which consists of FIGS. 3a-3d, shows an example of the method according to the invention with a process sequence using argon implantation;

FIG. 4, which consists of FIGS. 4a-4c, shows the continuation of the process sequences from FIGS. 2 and 3;

FIG. 5, which consists of FIGS. 5a-5d, shows an example according to the invention of the structures in a semiconductor memory cell in plan view, with word lines (a), trenches (b), active areas (c) and with these structures seen altogether (d)

DETAILED DESCRIPTION OF ILLUSTRATIVE EMBODIMENTS

Figure 2A:
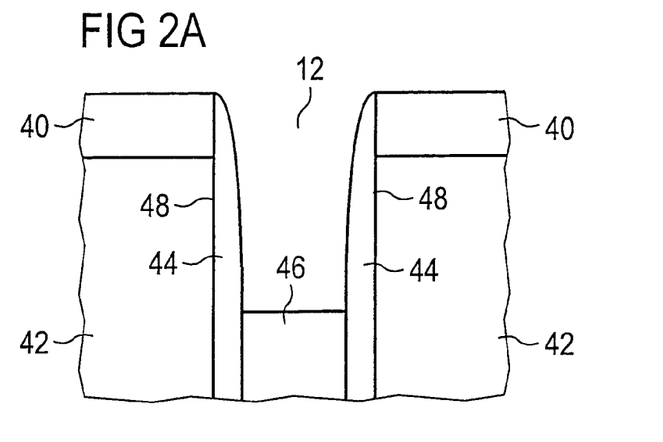

An exemplary embodiment for the method according to the invention for fabricating a semiconductor memory cell is illustrated in the form of a process sequence in FIG. 2. Up to a process step at which a trench 12 is formed in a substrate 42, with an insulation collar 44 having been formed, for example in a TEOS deposition step, at the trench inner wall 48 and with an etched-back conductive material 46 located in the trench, the process sequence substantially corresponds to the prior art. FIG. 2a shows a cross-section through a trench 12 in a semiconductor memory cell 1 up to this process instant. Up to this process step, two trench filling steps have been carried out, in each case with an etching-back step. The conductive material substantially comprises polysilicon. The insulation collar 44 is formed by thermal oxidation and subsequent oxide deposition. On the surface of the substrate 42 outside the trench 12 there is a pad nitride layer 40, which serves as a process end mark for etching steps, for example.

After the second step of etching back the polysilicon 46, an oblique implantation with $N_2$ with an angle of inclination of, for example, 30° with respect to the normal to the substrate surface is carried out. The oblique implantation is carried out from just one direction, i.e., in particular there is no significant rotation of the wafer during the implantation. In this way, the oxide layer 45 of the insulation collar within the trench 12 is implanted on just one side 50 of the trench. The opposite side 52 is shadowed from the implantation bombardment. As illustrated on the right-hand side of FIG. 2b, an approximately crescent-shaped part of the insulation collar 44 is implanted on the side 50.

Figure 2B:
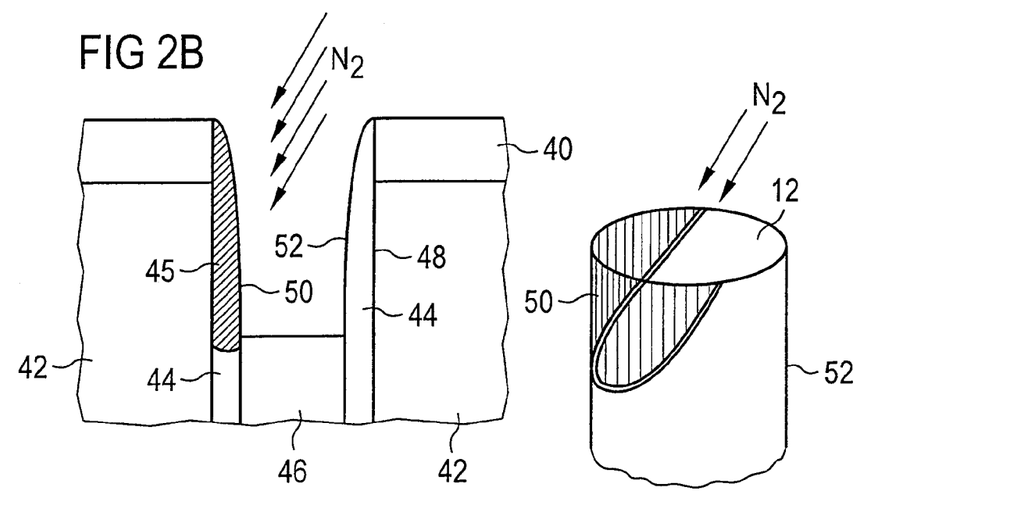

Then, an isotropic wet-etching step is applied to the wafer, with the implanted oxide 45 of the insulation collar 44 being subject to an etching rate which is approximately double the etching rate to which the unimplanted oxide on the opposite side 52 is subject. Parts of the insulation collar 44, which lie slightly below the top edge of the polysilicon 46 remain unimplanted on both sides.

Figure 2C:
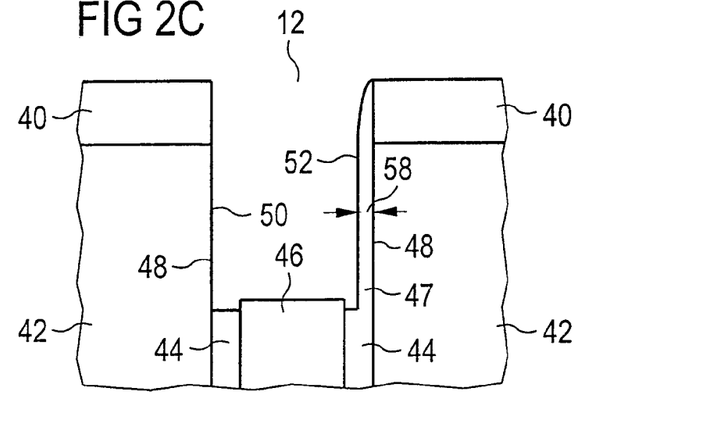

The increased etching rate uncovers the surface of the substrate 42 at the trench inner wall 48 on the side 50 of the trench 12 first. On the opposite side 52, the remaining oxide layer 47 of the insulation collar 44 still retains a thickness 58, which is approximately half the thickness at the start of the etching step.

Figure 3A:
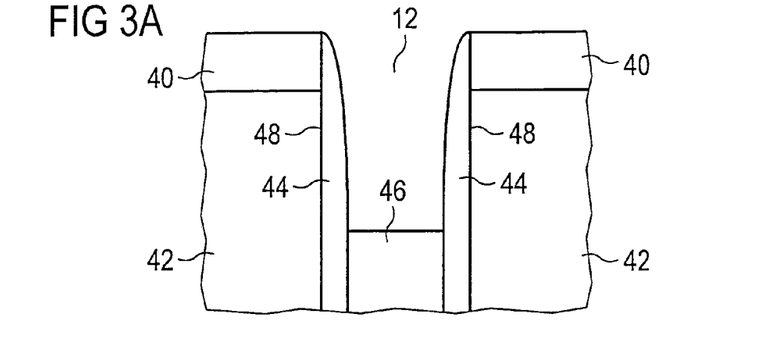
Figure 3B:
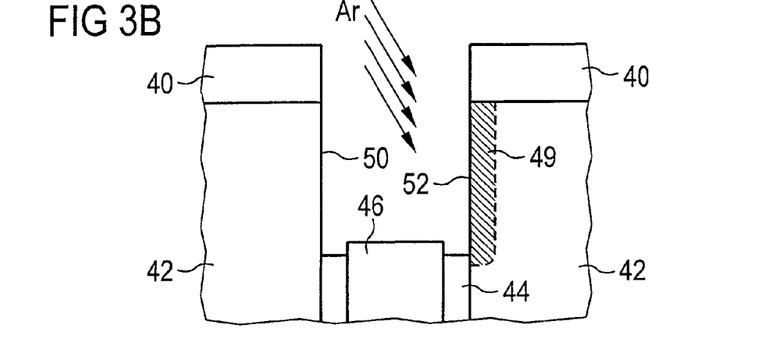
Figure 3C:
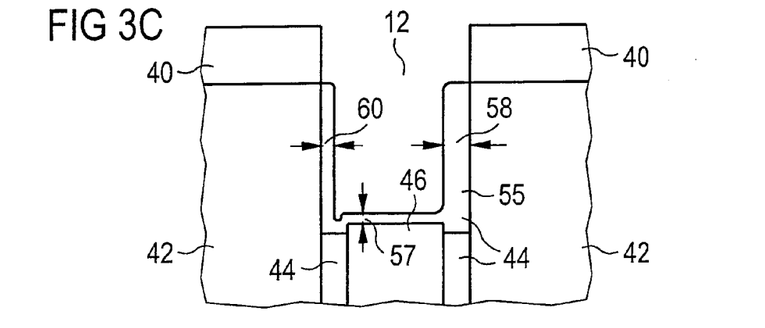

Before the continuation of the process sequence of this example is to be described, the following text will describe an alternative example for the process sequence for arriving at the state which has just been achieved in the first exemplary embodiment: starting from the cross-sectional profile of the trench 12, which is illustrated in FIG. 3a and is identical to the profile illustrated in FIG. 2a, unlike in the first exemplary embodiment, a wet-etching step for removing those parts of the insulation collar 44, which project above the conductive material 46 is carried out before the oblique implantation step. The substrate 42 is then uncovered in the trench inner walls 48. Then, argon implantation with an angle of inclination of, for example, 30° with respect to a perpendicular from the wafer is carried out on precisely one side 52 of the trench. Accordingly, the opposite side 50 in the trench 12 is shadowed from the implantation bombardment. A region 49 in the substrate 42 is doped by the argon bombardment (FIG. 3b). Then, thermal oxidation of the uncovered surfaces of the substrate 42 in the trench 12 is carried out. Since the argon-implanted substrate 42, during the thermal oxidation, has an oxidation rate, which is higher by a factor of 2, the thickness 58 of the oxide 55 grown on the side 52 is approximately double the thickness 60 on the opposite side 50. A similar statement is true of the thickness 57 of the oxide layer formed on the polysilicon filling 46.

Figure 3D:
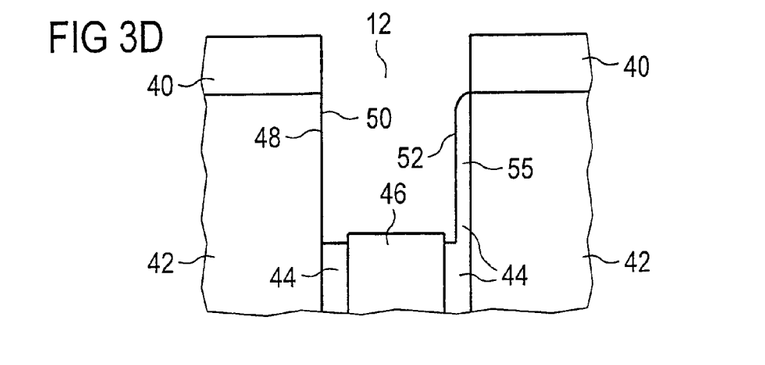

FIG. 3d shows the result of a subsequent isotropic etching step which is terminated when the surface of the trench inner wall 48 is uncovered on the side 50.

The dose strengths of the implantation steps shown in the first and second exemplary embodiments was in each case $10^{15}$ particles per square centimeter.

Figure 4A:
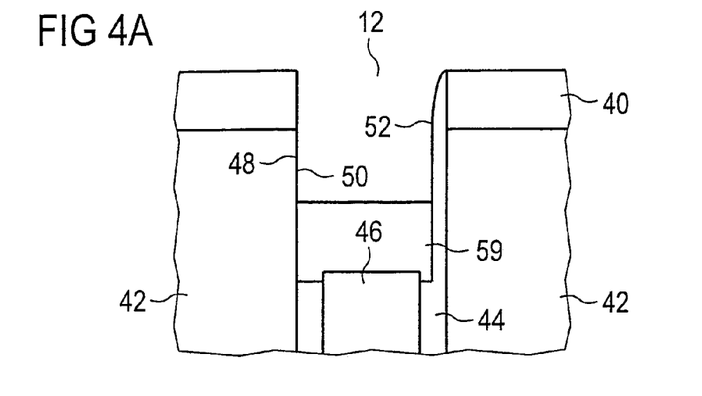
Figure 4B:
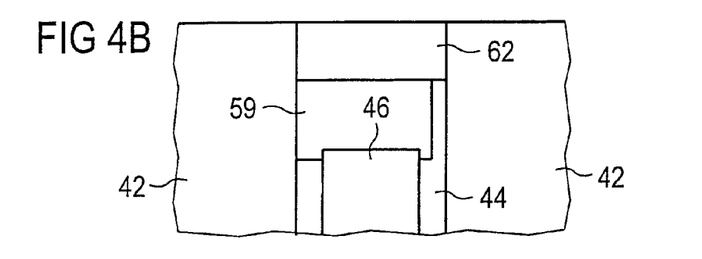

FIG. 4 shows the continuation of the process steps in accordance with the process of the invention. The only difference between the first and second exemplary embodiments is that in the first exemplary embodiment the thinned oxide collar 44 continues all the way up to the top edge of the pad nitride 40, whereas in the second exemplary embodiment there is naturally scarcely any oxidation at the inner wall of the pad nitride 40. A highly doped polysilicon layer 59 is deposited on the previous polysilicon filling 46 and etched back, so that the top edge of the silicon substrate 42 is still located above the top edge of the doped polysilicon layer 59 (FIG. 4a). Prior to the third filling with polysilicon 59, it is preferable to carry out nitriding of the uncovered surface of the substrate 42 in the trench 12, in order to ensure an advantageous treatment of the substrate in the region of the buried strap formed in the subsequent step.

Then, the shallow isolation trenches (STI) 20 are patterned in a lithographic step. The excerpt shown in FIG. 4 is in this case completely protected by a resist mask.

After the resist mask has been removed, the shallow isolation trenches (STI) 20 and the still open trench 12 are provided with an insulation layer. As can be seen from FIG. 4b, this leads to the formation of an oxide cover 62 in the trench opening. It is preferable for the insulation cover 62 to be deposited in an HDP process. The insulation cover 62 can also be referred to as a top trench oxide (TTO).

Figure 4C:
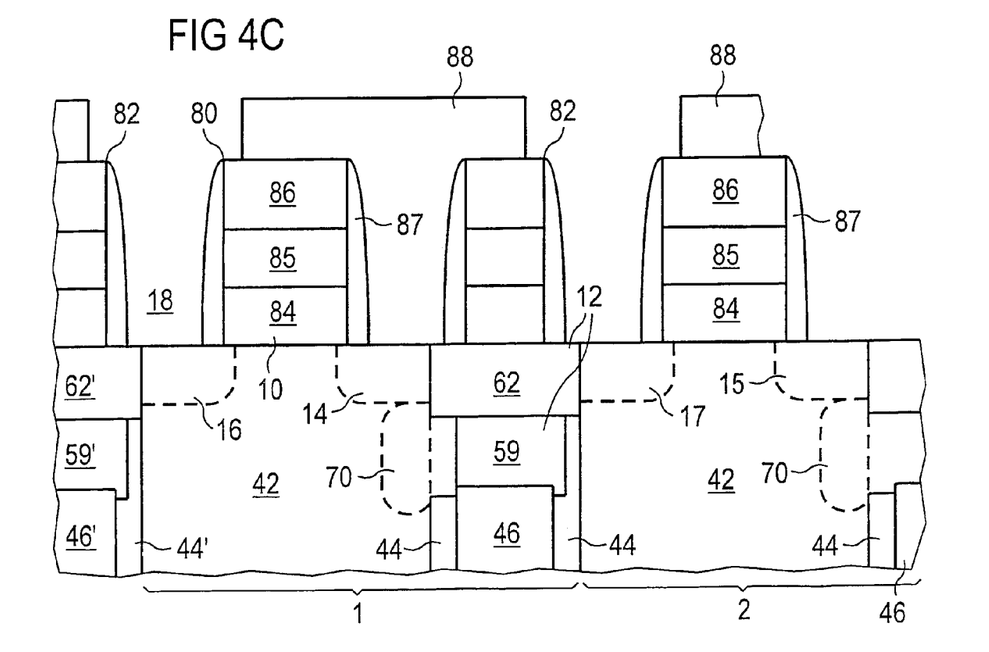

As shown in FIG. 4c, a buried strap 70 is formed through outdiffusion from the doped polysilicon 59 in a thermal process. As the process continues, first diffusion region 14 and second diffusion region 16 are formed in the substrate 42. These function as source and drain regions, respectively, for the planar select transistor to be formed. An active word line 80 and a passive word line 82 are formed on the substrate, with the active word line 80 comprising the gate contact 10. The word lines 80, 82 comprise a layer stack formed from polysilicon 84, tungsten silicide 85 and silicon nitride 86, with spacers 87 arranged laterally. A bit line contact 18 is formed self-aligned on the second diffusion region 16. As can be seen from FIG. 4c, the polysilicon filling 46, 59 of the trench 12 of the semiconductor memory cell 1 is insulated from the substrate 42 of the semiconductor memory cell 2 by the insulation collar 44 and the insulation cover 62. By contrast, the buried strap 70 produces contact with the substrate 42 of its own semiconductor memory cell 1.

FIG. 5 shows an arrangement of structures for the lithographic patterning on the wafer as an example for the semiconductor memory cell 1 according to the invention. FIG. 5a illustrates the word lines 80, 82. In the widened regions of the word lines, they form active word lines 80, whereas at the narrowed locations there are passive word lines 82, which run over the insulation cover of a trench 12, depending on the particular memory cell crossed by the word line.

Figure 5A:
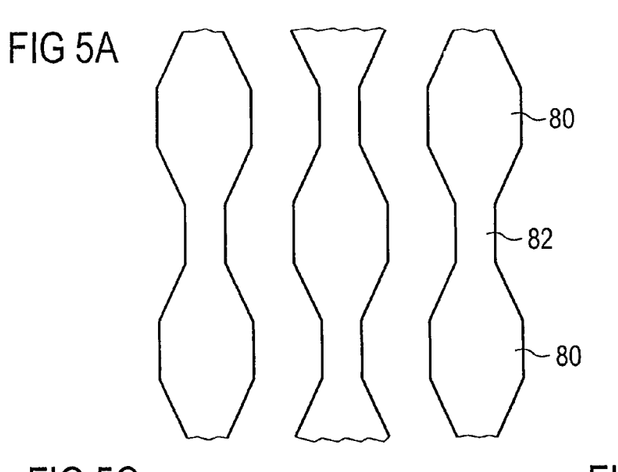
Figure 5B:
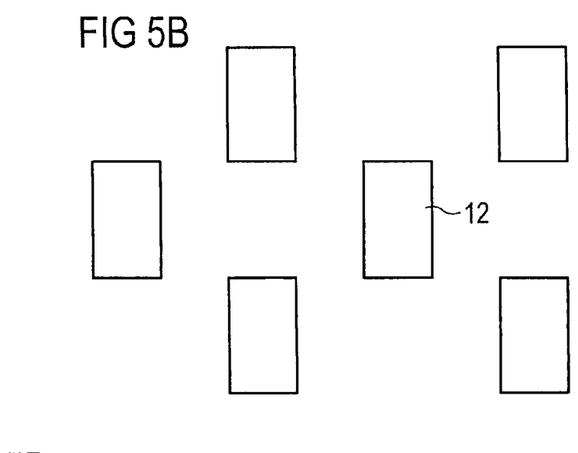

FIG. 5b illustrates rectangle structures for forming trenches 12. The advantageous regular pattern for the arrangement of trenches 12 shown as an alternative to pairs of trenches in accordance with the prior art is made possible by the combination of a layout of this type for trench cells in combination with the method for self-aligned formation of a buried strap 70 on one side for connection of the trench capacitor.

Figure 5C:
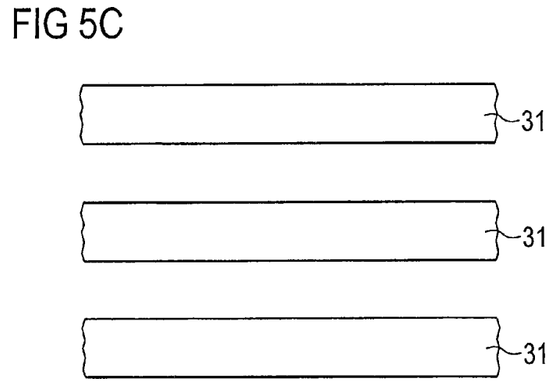

FIG. 5c shows the advantageous structure of long lines as structures 31 for forming active areas and the shallow trench isolation 20 (STI) between them.

Figure 5D:
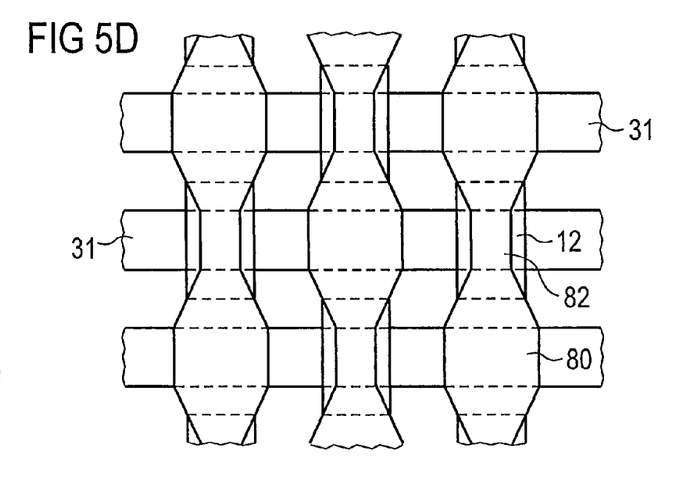

FIG. 5d shows a combined view of the structures from FIGS. 5a-c. It can be seen that, in particular for the structures 31 in the figure, there is a horizontal translational symmetry, thereby avoiding problems with corresponding overlay tolerances with the trenches 12.

Figure 6:
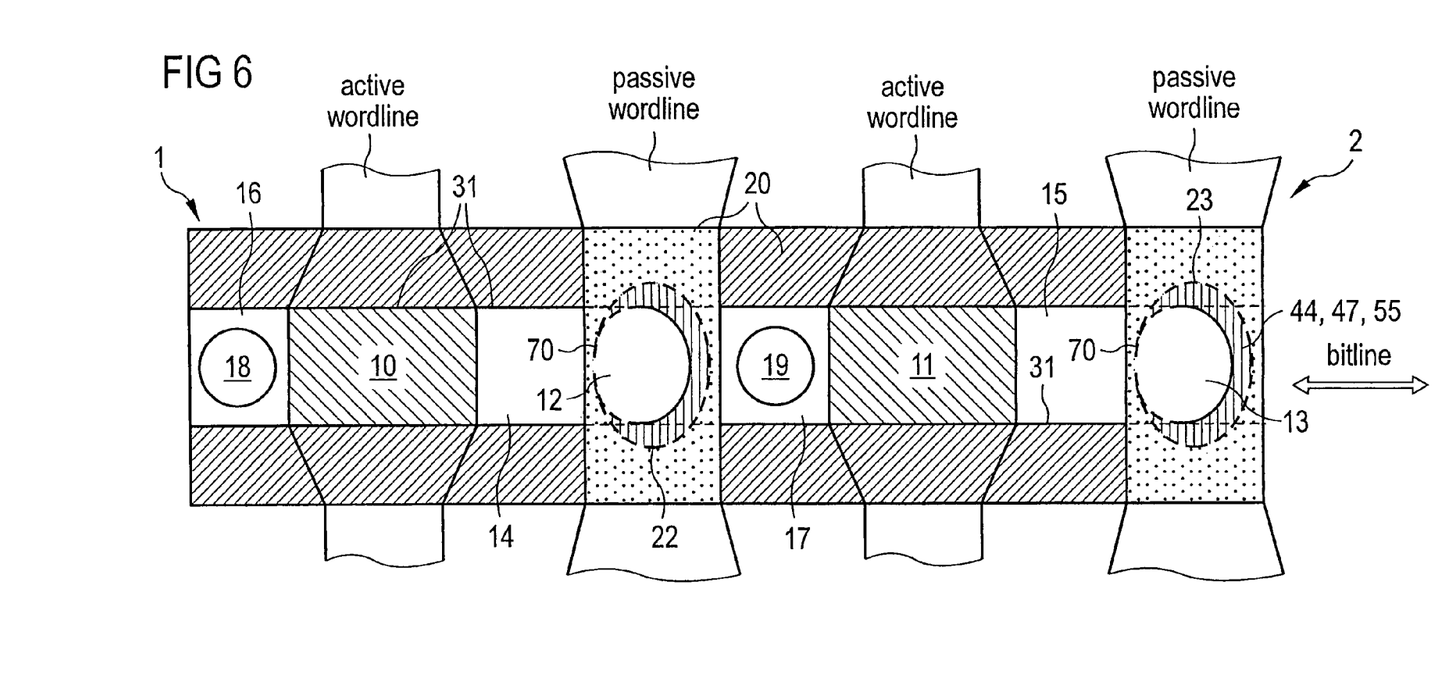
FIG. 6 shows a plan view of the example of two adjacent semiconductor memory cells according to the invention.

FIG. 6 shows a plan view of a semiconductor memory cell 1 according to the invention and its adjacent semiconductor memory cell 2. The two semiconductor memory cells 1, 2 are arranged next to one another with the same relative orientation of gate contact 10 with respect to trench 12 or gate contact 11 with respect to trench 13. Each semiconductor memory cell has its own bit line contact 18, 19. The trench 12 is insulated from the diffusion region 17 of the adjacent semiconductor memory cell 2 by the raised insulation collar 44, 47, 55, which is arranged on just one side of the trench 12. The opening for the buried strap 70 is located on the other side.

What is claimed is:

1. A semiconductor memory cell having a trench and a planar select transistor, the memory cell comprising:
    a substrate;
    a trench arranged in the substrate and having a trench inner wall with a lower region, a middle region and an upper region;
    a dielectric layer arranged in the lower region at the trench inner wall;
    a first insulation collar arranged at the trench inner wall in the middle and upper regions, the first insulation collar having an upper edge;
    a first flilling of the trench comprising a conductive material in the lower and middle regions;
    a first insulation layer for forming an insulation cover, the first insulation layer being arranged in the trench on the conductive material in an upper region of the trench and being connected to the insulation collar, the first insulation layer which forms the insulation cover covering the upper edge of the first insulation collar so as to extend to the trench inner wall above the upper edge of the first insulation collar;
    an opening in the insulation collar, which
        a) is placed on one side of the trench, completely beneath the insulation layer;
        b) from the trench faces toward a first gate contact of the memory cell;
        c) is filled with the conductive material;
    a buried doped region in the substrate, the buried doped region being electrically conductively coupled to the conductive material in the opening in order to form a buried strap;
    a planar select transistor, having the first gate contact of a first word line, a first diffusion region and a second diffusion region;

the first diffusion region being arranged in the substrate and being electrically conductively coupled to the buried doped region; and the second diffusion region being arranged in the substrate and being electrically conductively connected to a bit line contact.

2. A semiconductor memory cell having a trench and a planar select transistor, the memory cell comprising:
   a substrate;
   a trench arranged in the substrate and having a trench inner wall with a lower region, a middle region and an upper region;
   a dielectric layer arranged in the lower region at the trench inner wall;
   a first insulation collar arranged at the trench inner wall in the middle and upper regions, the first insulation collar having an upper edge;
   a first filling of the trench comprising a conductive material in the lower and middle regions;
   a first insulation layer for forming an insulation cover, the first insulation layer being arranged in the trench on the conductive material in an upper region of the trench and being connected to the insulation collar;
   an opening the insulation collar, which
      a) is placed on one side of the trench, completely beneath the insulation layer;
      b) from the trench faces toward a first sate contact of the memory cell;
      c) is filled with the conductive material;
   a buried doped region in the substrate, the buried doped region being electrically conductively coupled to the conductive material in the opening in order to form a buried strap;
   a planar select transistor, having the first gate contact of a first word line, a first diffusion region and a second diffusion region;
   the first diffusion region being arranged in the substrate and being electrically conductively coupled to the buried doped region;
   the second diffusion region being arranged in the substrate and being electrically conductively connected to a bit line contact;
   wherein the second diffusion region, on the opposite side from the trench and the first gate contact, adjoins a second trench of a second semiconductor memory cell; and
   wherein the second trench of the second semiconductor memory cell, on a side facing the second diffusion region, has a second insulation collar and a second insulation layer connected to the second insulation collar, so that a second conductive material in the second trench is insulated from the second diffusion region of the first semiconductor memory cell.

3. The memory cell as claimed in claim 1, wherein a second word line, which is passive for the semiconductor memory cell and is coupled to a second gate contact in an adjacent third semiconductor memory cell, is arranged above the insulation layer.

4. The memory cell as claimed in claim 1, wherein the first gate contact of a first word line has a first width, and in that a second word line, at a location within the memory cell above the insulation layer, has a second width, the first width being greater than the second width.

5. The memory cell as claimed in claim 1, wherein the memory cell is in each case isolated by precisely one isolation trench on each longitudinal side from an adjacent third semiconductor memory cell.

6. An arrangement of a plurality of semiconductor memory cells directly adjoining one another, each memory cell having a trench and planar select transistor, each trench having a trench inner wall with a lower region, a middle region, and an upper region, the arrangement being configured such that: the semiconductor memory cells of the arrangement each have a relative orientation of the planar select transistor with respect to the trench in a substrate, the relative orientation in the memory cell array, being identical for the plurality of semiconductor memory cells; and wherein each memory cell in the plurality, of memory cells has a surface area of less than 8 $F^2$, where F is the minimum feature size in lithographic projection, and wherein each memory cell comprises: a dielectric layer arranged in the lower region at the trench inner wall; a first insulation collar arranged at the trench inner wall in the middle and upper regions, the first insulation collar having an upper edge; a first filling of the trench comprising a conductive material in the lower and middle regions; a first insulation layer for forming an insulation cover, the first insulation layer being arranged in the trench on the conductive material in an upper region of the trench and being connected to the insulation collar; an opening in the insulation collar, which a) is placed on one side of the trench, completely beneath the insulation layer; b) from the trench faces toward a first gate contact of the memory cell; c) is filled with the conductive material; and
   a buried doped region in the substrate, the buried doped region being electrically conductively coupled to the conductive material in the opening in order to form a buried strap; wherein the planar select transistor comprises: the first gate contact of a first word line; a first diffusion region, the first diffusion region being arranged in the substrate and being electrically conductively coupled to the buried doped region; and a second diffusion region, the second diffusion region being arranged in the substrate and being electrically conductively connected to a bit line contact.

7. The arrangement as claimed in claim 6, wherein the trenches of the semiconductor memory cells are ranged In a chessboard-like pattern on the substrate, in a matrix arrangement formed by word lines and bit lines crossing one another, the word lines and bit lines being arranged substantially perpendicular to one another.

8. The arrangement as claimed in claim 7, wherein a proportion of more than two of the semiconductor memory cells has a common, cohesive active area.

9. The arrangement as claimed in claim 6, wherein, for a first memory cell, the second diffusion region, on the opposite side from the trench and the first gate contact adjoins a second trench of a second semiconductor memory cell.

10. The arrangement as claimed in claim 9, wherein the second trench of the second semiconductor memory cell, on a side facing the second diffusion region, has a second insulation collar and a second insulation layer connected to the second insulation collar, so that a second conductive material in the second trench is insulated from the second diffusion region of the first semiconductor memory cell.

11. The arrangement as claimed in claim 6, wherein a second word line, which is passive for a first semiconductor memory cell and is coupled to a second gate contact in an adjacent third semiconductor memory cell, is arranged above the insulation layer.

12. The arrangement as claimed in claim 6, wherein the first gate contact of a first word line has a first width, and in that a second word line, at a location within a first memory cell above the insulation layer, has a second width, the first width being greater than the second width.

13. The arrangement as claimed in claim 6, wherein each memory cell is isolated by precisely one isolation trench on each longitudinal side from an adjacent semiconductor memory cell.

14. A semiconductor memory cell having a trench and a planar select transistor, the memory cell comprising:
   a substrate;
   a trench arranged in the substrate and having a trench inner wall with a lower region, a middle region and an upper region;
   a dielectric layer arranged in the lower region at the trench inner wall;
   a first insulation collar arranged at the trench inner wall in the middle and upper regions, the first insulation collar having an upper edge;
   a first filling of the trench comprising a conductive material in the lower and middle regions;
   a first insulation layer for forming an insulation cover, the first insulation layer being arranged in the trench on the conductive material in an upper region of the trench and being connected to the insulation collar;
   an opening in the insulation collar, which
      a) is placed on one side of the trench, completely beneath the insulation layer;
      b) from the trench faces toward a first gate contact of the memory cell;
      c) is filled with the conductive material;
   a buried doped region in the substrate, the buried doped region being electrically conductively coupled to the conductive material in the opening in order to form a buried strap;
   a planar select transistor, having the first gate contact of a first word line, a first diffusion region and a second diffusion region;
   the first diffusion region being arranged in the substrate and being electrically conductively coupled to the buried doped region; and
   the second diffusion region being arranged in the substrate and being electrically conductively connected to a bit line contact;
   wherein the first gate contact of a first word line has a first width, and in that a second word line, at a location within the memory cell above the insulation layer, has a second width, the first width being greater than the second width.

15. The memory cell as claimed in claim 14, wherein a second word line, which is passive for the semiconductor memory cell and is coupled to a second gate contact in an adjacent third semiconductor memory cell, is arranged above the insulation layer.

16. The memory cell as claimed in claim 14, wherein the memory cell is in each case isolated by precisely one isolation trench on each longitudinal side from an adjacent third semiconductor memory cell.

17. The memory cell as claimed in claim 16, wherein:
   the second diffusion region, on the opposite side from the trench and the first gate contact, adjoins a second trench of a second semiconductor memory cell; and
   the second trench of the second semiconductor memory cell, on a side facing the second diffusion region, has a second insulation collar and a second insulation layer connected to the second insulation collar, so that a second conductive material in the second trench is insulated from the second diffusion region of the first semiconductor memory cell.

18. A semiconductor memory cell having a trench and a planar select transistor, the memory cell comprising:
   a substrate;
   a trench arranged in the substrate and having a trench inner wall with a lower region, a middle region and an upper region;
   a dielectric layer arranged in the lower region at the trench inner wall;
   a first insulation collar arranged at the trench inner wall in the middle end upper regions, the first insulation collar having an upper edge;
   a first filling of the trench comprising a conductive material in the lower and middle regions;
   a first insulation layer for forming an insulation cover, the first insulation layer being arranged in the trench on the conductive material in an upper region of the trench and being connected to the insulation collar;
   an opening in the insulation collar, which
      a) is placed on one side of the trench, completely beneath the insulation layer;
      b) from the trench faces toward a first gate contact of the memory cell;
      c) is filled with the conductive material;
   a buried doped region in the substrate, the buried doped region being electrically conductively coupled to the conductive material in the opening in order to form a buried strap;
   a planar select transistor, having the first gate contact of a first word line, a first diffusion region and a second diffusion region;
   the first diffusion region being arranged in the substrate and being electrically conductively coupled to the buried doped region; and
   the second diffusion region being arranged in the substrate and being electrically conductively connected to a bit line contact;
   wherein the memory cell is in each case isolated by precisely one isolation trench on each longitudinal side from an adjacent third semiconductor memory cell.

19. The memory cell as claimed in claim 18, wherein a second word line, which is passive for the semiconductor memory cell and is coupled to a second gate contact in an adjacent third semiconductor memory cell, is arranged above the insulation layer.

20. The memory cell as claimed in claim 19, wherein:
   the second diffusion region, on the opposite side from the trench and the first gate contact, adjoins a second trench of a second semiconductor memory cell; and
   the second trench of the second semiconductor memory cell, on a side facing the second diffusion region, has a second insulation collar and a second insulation layer connected to the second insulation collar, so that a second conductive material in the second trench is insulated from the second diffusion region of the first semiconductor memory cell.

21. The memory cell as claimed in claim 20, wherein the first gate contact of a first word line has a first width, and in that a second word line, at a location within the memory cell above the insulation layer, has a second width, the first width being greater than the second width.

* * * * *

UNITED STATES PATENT AND TRADEMARK OFFICE
CERTIFICATE OF CORRECTION

PATENT NO. : 7,256,440 B2  Page 1 of 1
APPLICATION NO. : 10/913797
DATED : August 14, 2007
INVENTOR(S) : Alsmeier It is certified that error appears in the above-identified patent and that said Letters Patent is hereby corrected as shown below:

In Col. 9, line 27, delete "sate" and insert --gate--.
In Col. 10, line 27, delete paragraph mark after "and" and continue text as one complete paragraph.
In Col. 10, line 40, delete "ranged In" and insert --arranged in--.
In Col. 12, line 12, delete "end" and insert --and--.

Signed and Sealed this

Fourth Day of December, 2007

JON W. DUDAS
*Director of the United States Patent and Trademark Office*